(12) United States Patent
Subbannavar et al.

(10) Patent No.: US 11,043,937 B1
(45) Date of Patent: Jun. 22, 2021

(54) REDUCED AREA, REDUCED POWER FLIP-FLOP

(71) Applicant: TEXAS INSTRUMENTS INCORPORATED, Dallas, TX (US)

(72) Inventors: Badarish Mohan Subbannavar, Bengaluru (IN); Arnab Khawas, Bengaluru (IN); Suvam Nandi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/713,343

(22) Filed: Dec. 13, 2019

(51) Int. Cl.
*H03K 3/037* (2006.01)
*H03K 3/012* (2006.01)

(52) U.S. Cl.
CPC ........... *H03K 3/0372* (2013.01); *H03K 3/012* (2013.01)

(58) Field of Classification Search
CPC .................................................. H03K 3/0372
See application file for complete search history.

(56) References Cited

U.S. PATENT DOCUMENTS

| 9,425,771 | B2 * | 8/2016 | Nandi | ................ | H03K 3/35625 |
| 9,628,062 | B1 * | 4/2017 | Le | ........................... | H03K 3/012 |
| 10,581,410 | B2 * | 3/2020 | Berzins | ............ | H03K 3/356113 |

* cited by examiner

*Primary Examiner* — Hai L Nguyen
(74) *Attorney, Agent, or Firm* — John R. Pessetto; Charles A. Brill; Frank D. Cimino

(57) ABSTRACT

A flip-flop having first and second shared transistors. The flip-flop including a tri-state inverter and a master latch configured to receive an output of the tri-state inverter. The flip-flop also having a slave latch coupled to the master latch, the slave latch including a slave tri-state inverter. The flip-flop further having an output inverter coupled to receive one of an output of the slave latch and an output of the master latch and configured to generate a flip-flop output. The first shared transistor configured to receive a clock signal and having a drain terminal coupled a first transistor in the tri-state inverter and a second transistor in the slave tri-state inverter. The second shared transistor configured to receive an inverted clock signal and having a drain terminal coupled a third transistor in the tri-state inverter and a fourth transistor in the slave tri-state inverter.

10 Claims, 4 Drawing Sheets

US 11,043,937 B1

REDUCED AREA, REDUCED POWER FLIP-FLOP

BACKGROUND

In many digital circuits, sequential cells or flip-flops often comprise a substantial portion of the digital design area, for example 30% to 40%. Flip-flops are also responsible for a substantial amount of the consumed digital power in a digital circuit, for example about 20%. Reducing the area and/or power of flip-flops, therefore, may reduce the area and/or power of a digital circuit.

SUMMARY

Illustrative examples described herein include a flip-flop circuit including a clock inverter, the clock inverter having a first PMOS transistor and a first NMOS transistor and configured to receive a clock signal and generate an inverted clock signal. The flip-flop circuit also including a tri-state inverter configured to receive a flip-flop input, the tri-state inverter having a second PMOS transistor configured to receive the clock signal and a second NMOS transistor configured to receive the inverted clock signal. The flip-flop circuit further including a master latch having a master latch transmission gate, the master latch transmission gate configured to receive an output of the tri-state inverter, the master latch transmission gate having a third NMOS transistor configured to receive the clock signal and a third PMOS transistor configured to receive the inverted clock signal. The flip-flop circuit also including a slave latch that includes a slave latch transmission gate configured to receive an output of the master latch, the slave latch transmission gate having a fourth NMOS transistor configured to receive the clock signal and a fourth PMOS transistor configured to receive the inverted clock signal. The slave latch also includes a slave inverter configured to receive an output of the slave latch transmission gate, and a slave tri-state inverter configured to receive an output of the slave inverter and having an output coupled to the slave inverter. The flip-flop circuit further includes an output inverter configured to receive the output of the slave latch transmission gate and the output of the slave tri-state inverter and to generate a flip-flop output. In the flip-flop circuit, the second PMOS transistor and second NMOS transistor are shared with the slave tri-state inverter.

Illustrative examples described herein also include a flip-flop circuit that includes a clock inverter having a first PMOS transistor and a first NMOS transistor, the clock inverter configured to receive a clock signal and generate an inverted clock signal. The flip-flop circuit also includes a tri-state inverter configured to receive a flip-flop input, the tri-state inverter having a second PMOS transistor configured to receive the clock signal and a second NMOS transistor configured to receive the inverted clock signal. The flip-flop circuit further includes a master latch configured to receive an output of the tri-state inverter. The master latch includes a first transmission gate having a third NMOS transistor and third PMOS transistor configured to receive the clock signal and inverted clock signal, respectively. The master latch also includes a second transmission gate comprising a fourth NMOS transistor and fourth PMOS transistor configured to receive the clock signal and inverted clock signal, respectively. The flip-flop circuit also includes a slave latch including a slave tri-state inverter configured to receive an output of the first transmission gate and having an output equal to an output of the second transmission gate. The flip-flop circuit also includes an output inverter configured to receive the output of the first transmission gate and to generate a flip-flop output. In the flip-flop, the second PMOS transistor and second NMOS transistor are shared with the slave tri-state inverter.

Illustrative examples described herein also include a flip-flop including a tri-state inverter configured to receive a flip-flop input, a clock signal and an inverted clock signal. The flip-flop also including a master latch configured to receive an output of the tri-state inverter and a slave latch coupled to the master latch, the slave latch having a slave tri-state inverter. The flip-flop further including an output inverter coupled to receive one of an output of the slave latch and an output of the master latch and configured to generate a flip-flop output. The flip-flip also includes first and second shared transistors. The first shared transistor is configured to receive a clock signal and has a drain terminal coupled a first transistor in the tri-state inverter and a second transistor in the slave tri-state inverter. The second shared transistor is configured to receive an inverted clock signal and has a drain terminal coupled a third transistor in the tri-state inverter and a fourth transistor in the slave tri-state inverter.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections.

Example flip-flop circuits described herein may have reduced area and power consumption because clock transistors are shared. Clock transistors are transistors that receive the clock signal or the inverted clock signal for the flip-flop. By sharing the clock transistors among the circuits in the flip-flop, the area and power of the flip-flop may be reduced. Below are two example flip-flop circuits that share clock transistors, but the present application contemplates any flip-flop circuitry where clock transistors are shared.

Figure 1:
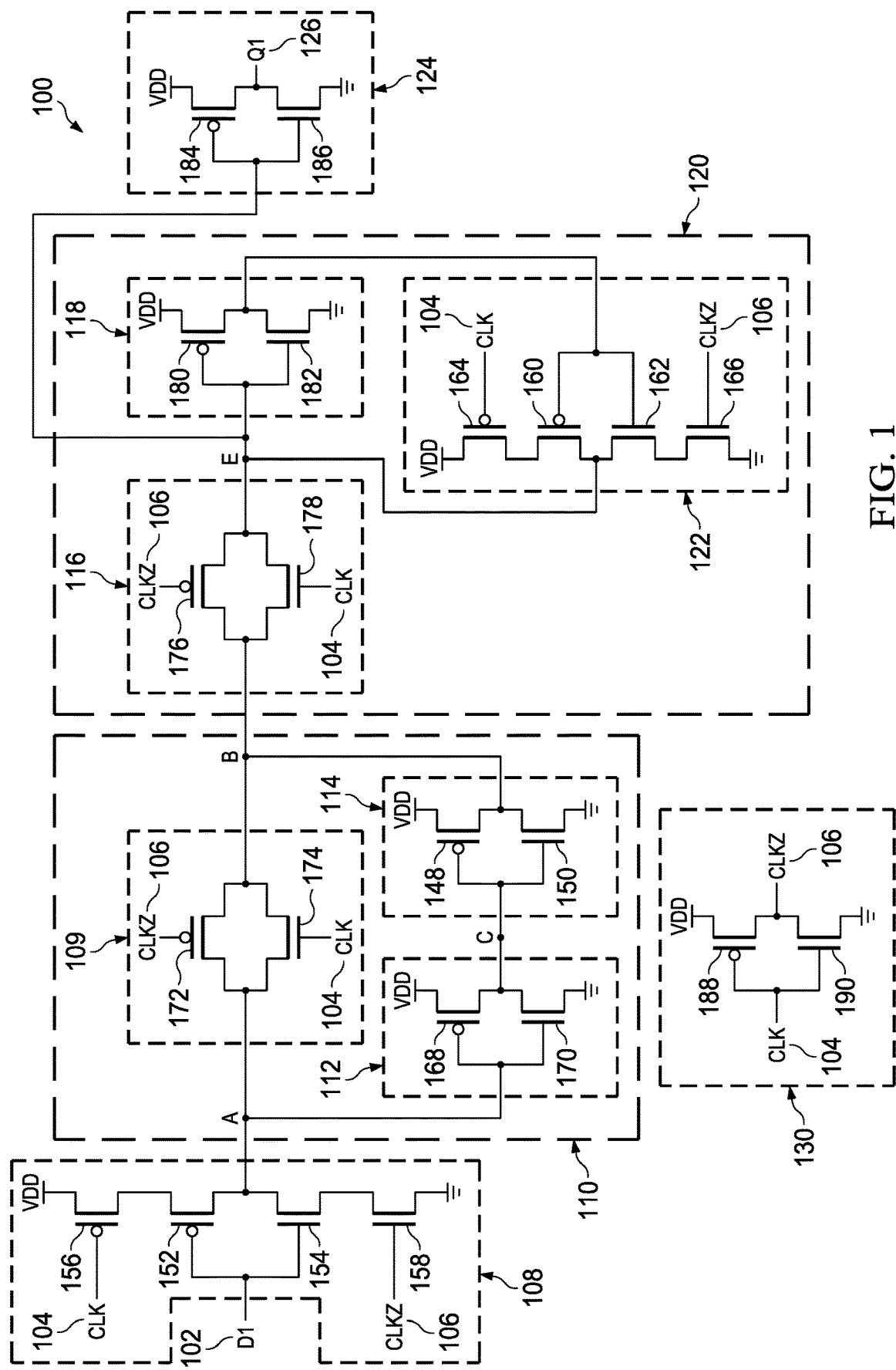
FIG. 1 illustrates an illustrative flip-flop.

FIG. 1 illustrates a schematic of a transistor level implementation of a flip-flop 100. The flip-flop 100 includes a tri-state inverter 108, a master latch 110, a slave latch 120, an output inverter 124 and a clock inverter 130. The tri-state inverter 108 receives a flip-flop input D1 102, a clock signal CLK 104 and an inverted clock signal CLKZ 106. The tri-state inverter 108 includes a PMOS transistor 152 and an NMOS transistor 154. A gate terminal of the PMOS transistor 152 and a gate terminal of the NMOS transistor 154 receive the flip-flop input D1 102. A drain terminal of the PMOS transistor 152 is coupled to a drain terminal of the NMOS transistor 154 to generate an output of the tri-state inverter 108 at a node A.

The tri-state inverter 108 further includes a PMOS transistor 156 and an NMOS transistor 158. A source terminal of the PMOS transistor 156 and a source terminal of the NMOS transistor 158 are coupled to a power terminal (VDD) and a ground terminal respectively. A drain terminal of the PMOS transistor 156 is coupled to a source terminal of the PMOS transistor 152. A drain terminal of the NMOS transistor 158 is coupled to a source terminal of the NMOS transistor 154. A gate terminal of the PMOS transistor 156 receives the clock signal CLK 104 and a gate terminal the NMOS transistor 158 receives the inverted clock signal CLKZ 106. In one example, when the flip-flop 100 is a negative edge triggered flip-flop, the PMOS transistor 156 receives the inverted clock signal CLKZ 106 and the NMOS transistor 158 receives the clock signal CLK 104.

The master latch 110 is coupled to the tri-state inverter 108. The master latch 110 includes a first transmission gate 109 that receives an output of the tri-state inverter 108 at the node A. The first transmission gate 109 also receives the clock signal CLK 104 and the inverted clock signal CLKZ 106. The first transmission gate 109 includes a PMOS transistor 172 and an NMOS transistor 174. A gate terminal of the PMOS transistor 172 receives the inverted clock signal CLKZ 106, and a gate terminal of the NMOS transistor 174 receives the clock signal CLK 104. A source terminal of the PMOS transistor 172 and a source terminal of the NMOS transistor 174 are coupled to the node A.

A drain terminal of the PMOS transistor 172 and a drain terminal of the NMOS transistor 174 are coupled to a node B. In one example, when the flip-flop 100 is a negative edge triggered flip-flop, the gate terminal of the PMOS transistor 172 receives the clock signal CLK 104, and the gate terminal of the NMOS transistor 174 receives the inverted clock signal CLKZ 106.

The master latch 110 also includes a first master inverter 112 that receives the output of the tri-state inverter 108. The first master inverter 112 includes a PMOS transistor 168 and an NMOS transistor 170. A gate terminal of the PMOS transistor 168 and a gate terminal of the NMOS transistor 170 are coupled to the node A. A source terminal of the PMOS transistor 168 and a source terminal of the NMOS transistor 170 are coupled to the power terminal (VDD) and the ground terminal respectively. A drain terminal of the PMOS transistor 168 and a drain terminal of the NMOS transistor 170 are coupled to generate an output of the first master inverter 112 at the node C.

The master latch 110 also includes a second master inverter 114. The second master inverter 114 includes a PMOS transistor 148 and an NMOS transistor 150. A gate terminal of the PMOS transistor 148 and a gate terminal of the NMOS transistor 150 are coupled to each other and receive the output of the first master inverter 112 at node C. A source terminal of the PMOS transistor 148 and a source terminal of the NMOS transistor 150 are coupled to a power terminal (VDD) and a ground terminal respectively. A drain terminal of the PMOS transistor 148 is coupled to a drain terminal of the NMOS transistor 150 to generate an output of the second master inverter 114 at the node B.

The slave latch 120 includes a second transmission gate 116, which is coupled to the node B, the first transmission gate 109 and the second master inverter 114. The second transmission gate 116 also receives the clock signal CLK 104 and the inverted clock signal CLKZ 106. The second transmission gate 116 includes a PMOS transistor 176 and an NMOS transistor 178. A gate terminal of the PMOS transistor 176 receives the inverted clock signal CLKZ 106, and a gate terminal of the NMOS transistor 178 receives the clock signal CLK 104. A source terminal of the PMOS transistor 176 and a source terminal of the NMOS transistor 178 are coupled to the node B. A drain terminal of the PMOS transistor 176 and a drain terminal of the NMOS transistor 178 are coupled to a node E. In one example, when the flip-flop 100 is a negative edge triggered flip-flop, the gate terminal of the PMOS transistor 176 receives the clock signal CLK 104, and the gate terminal of the NMOS transistor 178 receives the inverted clock signal CLKZ 106.

The slave latch 120 also includes a slave inverter 118. The slave inverter 118 receives an output of the second transmission gate 116 at the node E. The slave inverter 118 includes a PMOS transistor 180 and an NMOS transistor 182. A gate terminal of the PMOS transistor 180 and a gate terminal of the NMOS transistor 182 are coupled to each other and to the node E. A source terminal of the PMOS transistor 180 and a source terminal of the NMOS transistor 182 are coupled to a power terminal (VDD) and a ground terminal respectively. A drain terminal of the PMOS transistor 180 is coupled to a drain terminal of the NMOS transistor 182 to generate an output of the slave inverter 118.

The slave latch 120 further includes a slave tri-state inverter 122 that receives an output of the slave inverter 118. The output of the first transmission gate 109 is equal to the output of the slave inverter 118. Also, the output of the second transmission gate 116 is equal to the output of the slave tri-state inverter 122 and the output of the slave inverter 118. The slave tri-state inverter 122 receives the clock signal CLK 104 and the inverted clock signal CLKZ 106. The slave tri-state inverter 122 includes a PMOS transistor 160 and an NMOS transistor 162. A gate terminal of the PMOS transistor 160 and a gate terminal of the NMOS transistor 162 receive the output of the slave inverter 118. A drain terminal of the PMOS transistor 160 is coupled to a drain terminal of the NMOS transistor 162 to generate an output of the slave tri-state inverter 122 at the node E.

The slave tri-state inverter 122 also includes a PMOS transistor 164 and an NMOS transistor 166. A source terminal of the PMOS transistor 164 and a source terminal of the NMOS transistor 166 are coupled to the power terminal (VDD) and the ground terminal respectively. A drain terminal of the PMOS transistor 164 is coupled to a source terminal of the PMOS transistor 160 and a drain terminal NMOS transistor 166 is coupled to a source terminal of the NMOS transistor 162. A gate terminal of the PMOS transistor 164 receives a clock signal CLK 104 and a gate terminal of the NMOS transistor 166 receives the inverted clock signal CLKZ 106.

The slave inverter 118 receives an output of the slave tri-state inverter 122. The output inverter 124 is coupled to the node E, the second transmission gate 116 and the slave tri-state inverter 122 and generates flip-flop output Q1 126. The output inverter 124 includes a PMOS transistor 184 and an NMOS transistor 186. A gate terminal of the PMOS transistor 184 and a gate terminal of the NMOS transistor 186 receive the output of the slave tri-state inverter 122. A source terminal of the PMOS transistor 184 and a source terminal of the NMOS transistor 186 are coupled to the power terminal (VDD) and the ground terminal respectively. A drain terminal of the PMOS transistor 184 is coupled to a drain terminal of the NMOS transistor 186 to generate the flip-flop output Q1 126.

The clock inverter 130 receives the clock signal CLK 104 and generates the inverted clock signal CLKZ 106. The clock inverter 130 includes a PMOS transistor 188 and an NMOS transistor 190. A gate terminal of the PMOS transistor 188 and a gate terminal of the NMOS transistor 190 receive the clock signal CLK 104. A source terminal of the PMOS transistor 188 and a source terminal of the NMOS transistor 190 are coupled to the power terminal (VDD) and the ground terminal respectively. A drain terminal of the PMOS transistor 188 is coupled to a drain terminal of the NMOS transistor 190 to generate the inverted clock signal CLKZ 106.

Figure 2:
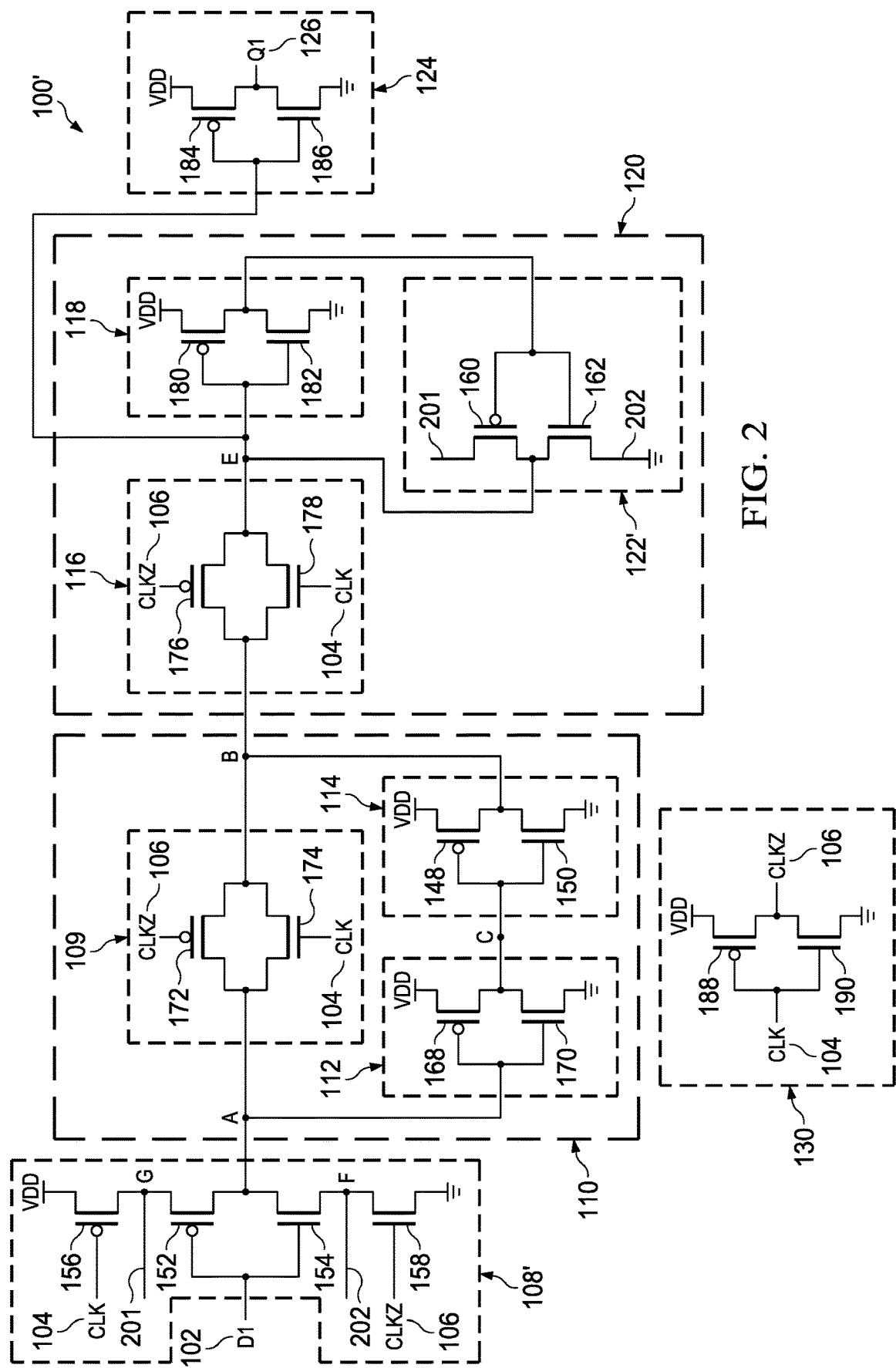
FIG. 2 illustrates an illustrative modification to the flip-flop of FIG. 1.

FIG. 2 illustrates a schematic of a transistor level implementation of a flip-flop 100'. Flip-flop 100' is the same as flip-flop 100 of FIG. 1, except that flip flop 100' has two less transistors because transistors are shared. In particular, PMOS transistor 156 receiving clock signal CLK 104 and NMOS transistor 158 receiving inverted clock signal CLZ 106 are shared by the tri-state inverter 108' and slave tri-state inverter 122'. Transistors 164 and 166 may therefore be eliminated, since the CLK input 104 and inverted clock signal CLKZ 106 are received at the slave tri-state inverter 122' by the transistors 156 and 158 of tri-state inverter 108'. In this way, the area and power consumption of flip-flop 100' has been reduced as compared to flip-flop 100 of FIG. 1.

In flip-flop 100', a source terminal 201 of PMOS transistor 160 of the slave tri-state inverter 122' is coupled to a node G, which couples the drain terminal of PMOS transistor 156 to the source terminal of PMOS transistor 152. In this way, PMOS transistor 160 receives clock signal CLK 104 from PMOS transistor 156 of tri-state inverter 108', and PMOS transistor 164 can be eliminated from slave tri-state inverter 122'. Tri-state inverter 108' and slave tri-state inverter 122' share PMOS transistor 156. In addition, a source terminal 201 of NMOS transistor 162 of the slave tri-state inverter 122' is coupled to a node F, which couples the drain terminal of NMOS transistor 158 to the source terminal of NMOS transistor 154. In this way, NMOS transistor 162 receives inverted clock signal CLKZ 106 from NMOS transistor 158 of tri-state inverter 108', and NMOS transistor 166 can be eliminated from slave tri-state inverter 122'. Tri-state inverter 108' and slave tri-state inverter 122' share NMOS transistor 158. With transistors 164 and 166 eliminated, flip-flop 100' has two less transistors than flip-flop 100 of FIG. 1. While FIG. 2 shows shared PMOS transistor 156 and shared NMOS transistor 158 as being part of tri-state inverter 108', shared PMOS transistor 156 and shared NMOS transistor 158 may also be considered to be in slave tri-state inverter 122' or in both tri-state inverter 108' and slave tri-state inverter 122'.

Figure 3:
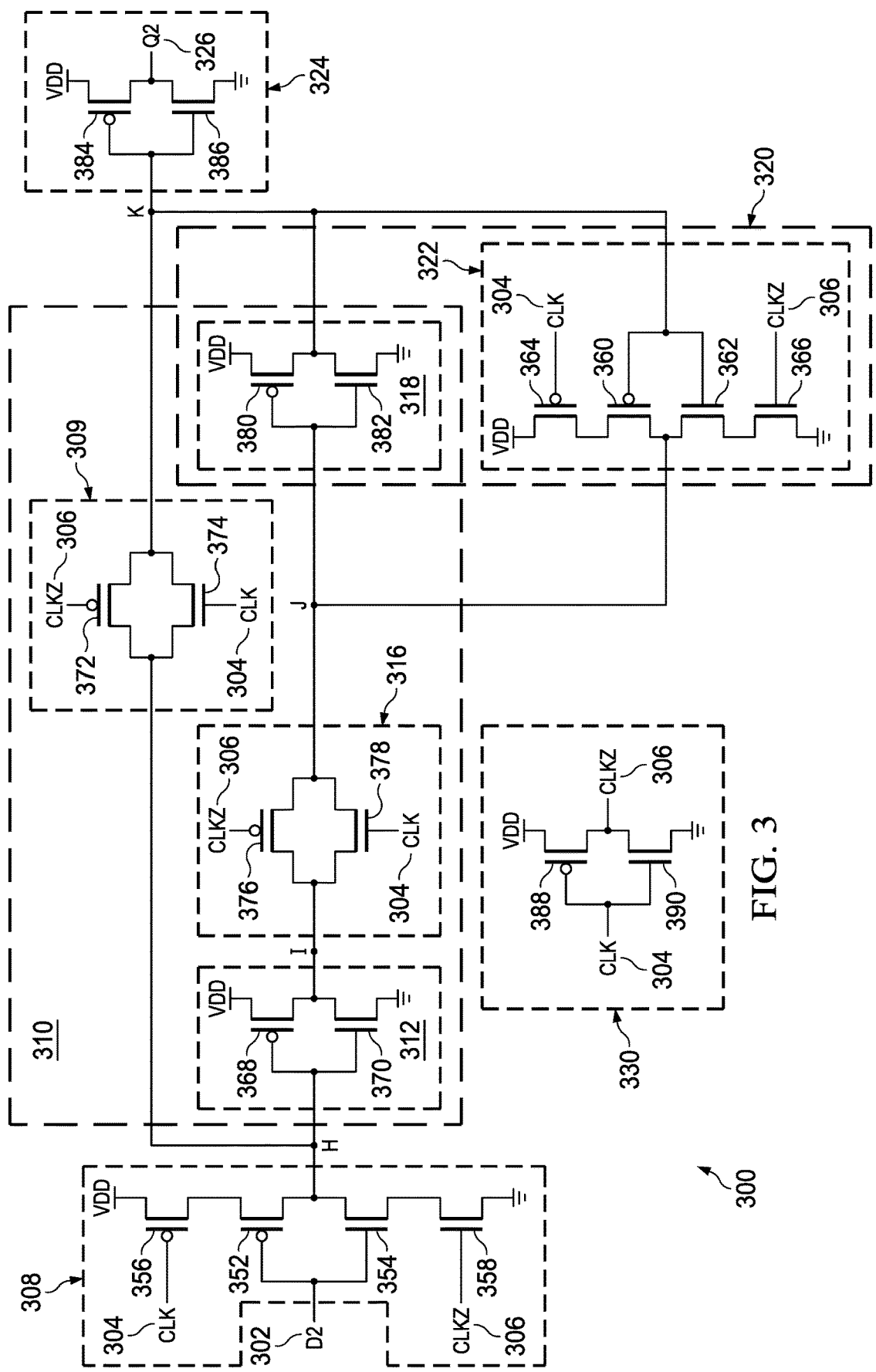
FIG. 3 illustrates an illustrative flip-flop.

FIG. 3 illustrates a schematic of a transistor level implementation of a flip-flop 300, which may be similar to that disclosed in U.S. Pat. No. 9,425,771, incorporated by reference herein. The flip-flop 300 includes a tri-state inverter 308, a master latch 310, a slave latch 320, an output inverter 324 and a clock inverter 330. The tri-state inverter 308 receives a flip-flop input D2 302, a clock signal CLK 304 and an inverted clock signal CLKZ 306. The tri-state inverter 308 includes a PMOS transistor 352 and an NMOS transistor 354. A gate terminal of the PMOS transistor 352 and a gate terminal of the NMOS transistor 354 receive the flip-flop input D2 302. A drain terminal of the PMOS transistor 352 is coupled to a drain terminal of the NMOS transistor 354 to generate an output of the tri-state inverter 308 at a node H.

The tri-state inverter 308 further includes a PMOS transistor 356 and an NMOS transistor 358. A source terminal of the PMOS transistor 356 and a source terminal of the NMOS transistor 358 are coupled to a power terminal (VDD) and a ground terminal respectively. A drain terminal of the PMOS transistor 356 is coupled to a source terminal of the PMOS transistor 352. A drain terminal of the NMOS transistor 358 is coupled to a source terminal of the NMOS transistor 354. A gate terminal of the PMOS transistor 356 receives the clock signal CLK 304 and a gate terminal of the NMOS transistor 358 receives the inverted clock signal CLKZ 306.

In one example, when the flip-flop 300 is a negative edge triggered flip-flop, the PMOS transistor 356 receives the inverted clock signal CLKZ 306 and the NMOS transistor 358 receives the clock signal CLK 304.

The master latch 310 is coupled to the tri-state inverter 308. The master latch 310 includes a first transmission gate 309 that receives an output of the tri-state inverter 308 at the node H. The first transmission gate 309 also receives the clock signal CLK 304 and the inverted clock signal CLKZ 306. The first transmission gate 309 includes a PMOS transistor 372 and an NMOS transistor 374. A gate terminal of the PMOS transistor 372 receives the inverted clock signal CLKZ 306, and a gate terminal of the NMOS transistor 374 receives the clock signal CLK 304. A source terminal of the PMOS transistor 372 and a source terminal of the NMOS transistor 374 are coupled to the node H.

A drain terminal of the PMOS transistor 372 and a drain terminal of the NMOS transistor 374 are coupled to a node K. In one example, when the flip-flop 300 is a negative edge triggered flip-flop, the gate terminal of the PMOS transistor 372 receives the clock signal CLK 304, and the gate terminal of the NMOS transistor 374 receives the inverted clock signal CLKZ 306.

The master latch 310 also includes a master inverter 312 that receives the output of the tri-state inverter 308. The master inverter 312 includes a PMOS transistor 368 and an NMOS transistor 370. A gate terminal of the PMOS transistor 368 and a gate terminal of the NMOS transistor 370 are coupled to the node H. A source terminal of the PMOS transistor 368 and a source terminal of the NMOS transistor 370 are coupled to the power terminal (VDD) and the ground terminal respectively. A drain terminal of the PMOS transistor 368 and a drain terminal of the NMOS transistor 370 are coupled to generate an output of the master inverter 312 at the node I.

The second transmission gate 316 is coupled to the node I and the master inverter 312. The second transmission gate 316 also receives the clock signal CLK 304 and the inverted clock signal CLKZ 306. The second transmission gate 316 includes a PMOS transistor 376 and an NMOS transistor 378. A gate terminal of the PMOS transistor 376 receives the inverted clock signal CLKZ 306, and a gate terminal of the NMOS transistor 378 receives the clock signal CLK 304. A source terminal of the PMOS transistor 376 and a source terminal of the NMOS transistor 378 are coupled to the node I. A drain terminal of the PMOS transistor 376 and a drain terminal of the NMOS transistor 378 are coupled to a node J. In one example, when the flip-flop 300 is a negative edge triggered flip-flop, the gate terminal of the PMOS transistor 376 receives the clock signal CLK 304, and the gate terminal of the NMOS transistor 378 receives the inverted clock signal CLKZ 306.

The master latch 310 also includes a common inverter 318. The common inverter 318 is shared by the master latch 310 and the slave latch 320. The common inverter 318 receives an output of the second transmission gate 316. The common inverter 318 includes a PMOS transistor 380 and an NMOS transistor 382. A gate terminal of the PMOS transistor 380 and a gate terminal of the NMOS transistor 382 are coupled to each other and receive the output of the second transmission gate 316. A source terminal of the PMOS transistor 380 and a source terminal of the NMOS transistor 382 are coupled to a power terminal (VDD) and a ground terminal respectively. A drain terminal of the PMOS transistor 380 is coupled to a drain terminal of the NMOS transistor 382 to generate an output of the common inverter 318 at the node K.

The slave latch 320 also includes a slave tri-state inverter 322 that receives an output of the first transmission gate 309 and an output of the common inverter 318 at the node K. The output of the first transmission gate 309 is equal to the output of the common inverter 318. Also, the output of the second transmission gate 316 is equal to the output of the slave tri-state inverter 322. The slave tri-state inverter 322 receives the clock signal CLK 304 and the inverted clock signal CLKZ 306. The slave tri-state inverter 322 includes a PMOS transistor 360 and an NMOS transistor 362. A gate terminal of the PMOS transistor 360 and a gate terminal of the NMOS transistor 362 receive the output of the common inverter 318. A drain terminal of the PMOS transistor 360 is coupled to a drain terminal of the NMOS transistor 362 to generate an output of the slave tri-state inverter 322.

The slave tri-state inverter 322 also includes a PMOS transistor 364 and an NMOS transistor 366. A source terminal of the PMOS transistor 364 and a source terminal of the NMOS transistor 366 are coupled to the power terminal (VDD) and the ground terminal respectively. A drain terminal of the PMOS transistor 364 is coupled to a source terminal of the PMOS transistor 360 and a drain terminal of the NMOS transistor 366 is coupled to a source terminal of the NMOS transistor 362. A gate terminal of the PMOS transistor 364 receives a clock signal CLK 304 and a gate terminal of the NMOS transistor 366 receives the inverted clock signal CLKZ 306.

The common inverter 318 receives an output of the slave tri-state inverter 322. The output inverter 324 is coupled to the common inverter 318 and generates flip-flop output Q2 326. The output inverter 324 includes a PMOS transistor 384 and an NMOS transistor 386. A gate terminal of the PMOS transistor 384 and a gate terminal of the NMOS transistor 386 receive the output of the common inverter 318. A source terminal of the PMOS transistor 384 and a source terminal of the NMOS transistor 386 are coupled to the power terminal (VDD) and the ground terminal respectively. A drain terminal of the PMOS transistor 384 is coupled to a drain terminal of the NMOS transistor 386 to generate the flip-flop output Q2 326.

The clock inverter 330 receives the clock signal CLK 304 and generates the inverted clock signal CLKZ 306. The clock inverter 330 includes a PMOS transistor 388 and an NMOS transistor 390. A gate terminal of the PMOS transistor 388 and a gate terminal of the NMOS transistor 390 receive the clock signal CLK 304. A source terminal of the PMOS transistor 388 and a source terminal of the NMOS transistor 390 are coupled to the power terminal (VDD) and the ground terminal respectively. A drain terminal of the PMOS transistor 388 is coupled to a drain terminal of the NMOS transistor 390 to generate the inverted clock signal CLKZ 306.

Figure 4:
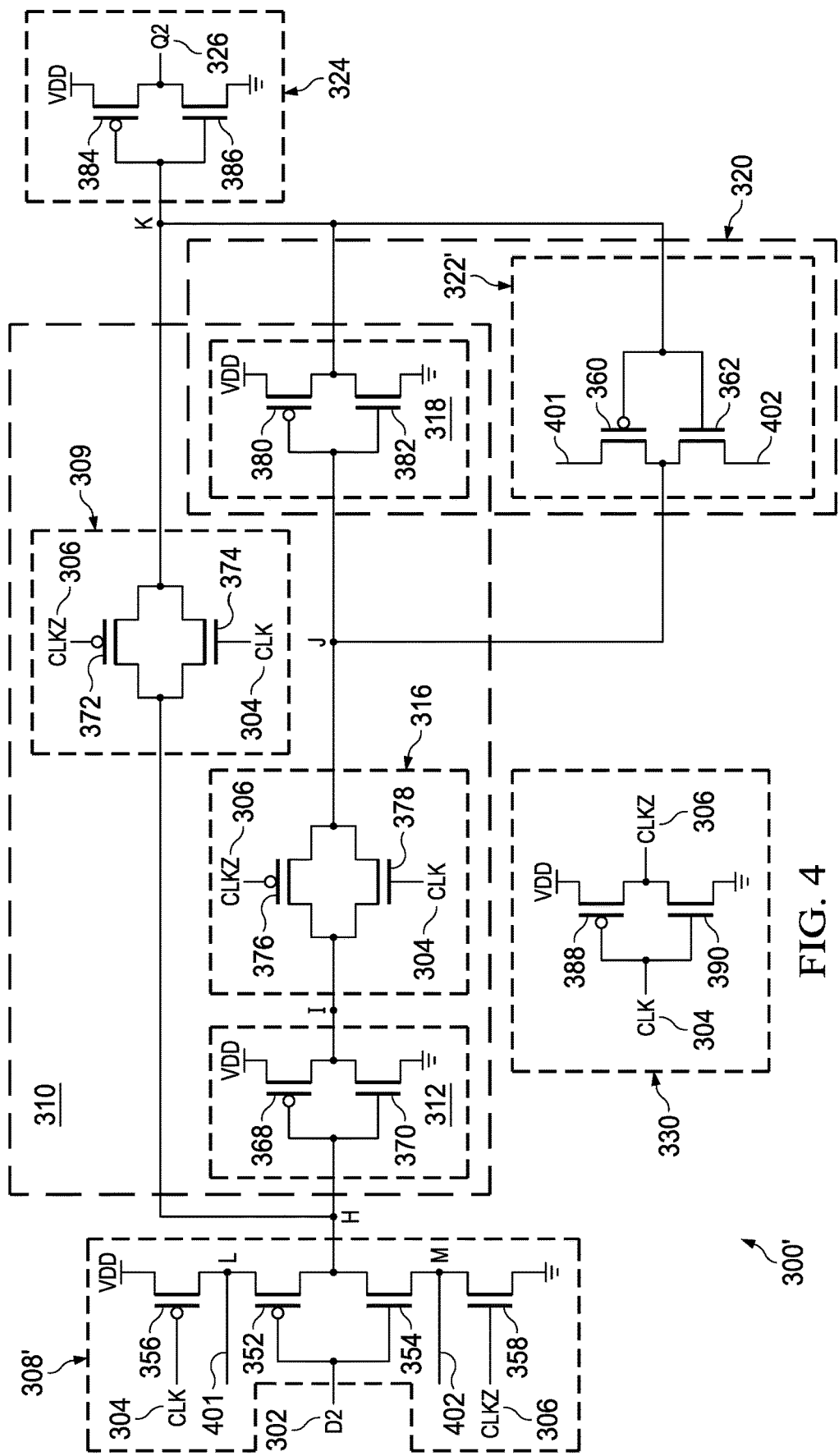
FIG. 4 illustrates an illustrative modification to the flip-flop of FIG. 3.

FIG. 4 illustrates a schematic of a transistor level implementation of a flip-flop 300'. Flip-flop 300' is the same as flip-flop 300 of FIG. 3, except that flip flop 300' has two less transistors because transistors are shared. In particular, PMOS transistor 356 receiving clock signal CLK 304 and NMOS transistor 358 receiving inverted clock signal CLZ 306 are shared by the tri-state inverter 308' and slave tri-state inverter 322'. Transistors 364 and 366 may therefore be eliminated, since the clock signal CLK 304 and inverted clock signal CLKZ 306 are received at the slave tri-state inverter 322' by the transistors 356 and 358 of tri-state inverter 308'. In this way, the area and power consumption of flip-flop 300' has been reduced as compared to flip-flop 300 of FIG. 3.

In flip-flop 300', a source terminal 401 of PMOS transistor 360 of the slave tri-state inverter 322 is coupled to node L, which couples the drain terminal of PMOS transistor 356 to the source terminal of PMOS transistor 352. In this way, PMOS transistor 360 receives clock signal CLK 304 from PMOS transistor 356 of tri-state inverter 308', and PMOS transistor 364 can be eliminated from slave tri-state inverter 322'. Tri-state inverter 308' and slave tri-state inverter 322' share PMOS transistor 356. In addition, a source terminal 402 of NMOS transistor 361 of the slave tri-state inverter 322' is coupled to node M, which couples the drain terminal of NMOS transistor 358 to the source terminal of NMOS transistor 354. In this way, NMOS transistor 362 receives inverted clock signal CLKZ 306 from NMOS transistor 358 of tri-state inverter 308', and NMOS transistor 366 can be eliminated from slave tri-state inverter 322'. Tri-state inverter 308' and slave tri-state inverter 322' share NMOS transistor 358. With transistors 364 and 366 eliminated, flip-flop 300' has two less than flip-flop 300 of FIG. 3. While FIG. 4 shows shared PMOS transistor 356 and shared NMOS transistor 358 as being part of tri-state inverter 308', shared PMOS transistor 356 and shared NMOS transistor 358 may also be considered to be in slave tri-state inverter 322' or in both tri-state inverter 308' and slave tri-state inverter 322'.

Modifications are possible in the described embodiments, and other embodiments are possible, within the scope of the claims.

What is claimed is:

1. A flip-flop circuit comprising:
   a clock inverter having a input and an output wherein the clock inverter is configured to receive a clock signal and generate an inverted clock signal;
   a tri-state inverter configured to receive a flip-flop input, the tri-state inverter comprising a first PMOS transistor having a gate, drain and source wherein the gate of first PMOS transistor is configured to receive the clock signal and a first NMOS transistor having a gate, drain and source wherein the gate of first NMOS transistor is configured to receive the inverted clock signal;
   a master latch configured to receive an output of the tri-state inverter, the master latch comprising:
      a first transmission gate having an input and output wherein the input is coupled to a drain of a second PMOS transistor and to a drain of a second NMOS transistor, the output is coupled to a source of the second PMOS transistor and to a source of the second NMOS transistor, a gate of the second PMOS transistor is coupled to the output of the clock inverter and a gate of the second NMOS transistor is configured to receive the clock signal; and
      a second transmission gate having an input and output wherein the input is coupled to a drain of a third PMOS transistor and to a drain of a third NMOS transistor, the output is coupled to a source of the third PMOS transistor and to a source of the third NMOS transistor, a gate of the third PMOS transistor is coupled to the output of the clock inverter and a gate of the third NMOS transistor is configured to receive the clock signal;
   a slave latch comprising a slave tri-state inverter, the slave tri-state converter comprising a fourth NMOS transistor and a fourth PMOS transistor wherein a source of the fourth NMOS transistor is coupled to the drain of the first NMOS transistor and a source of the fourth PMOS transistor is coupled to the drain of the first NMOS transistor; and an output inverter having an input and an output wherein the output of the first transmission gate is coupled to the input of the output inverter, and the output of the output inverter is configured to generate a flip-flop output.

2. The flip-flop circuit of claim 1, wherein the master latch further comprises:
   a master inverter having an input and an output, wherein the input of the master converter is coupled to the output of the tri-state inverter, and wherein the input of the second transmission gate is coupled to the output of the master inverter; and
   a common inverter having an input and an output wherein the output of the second transmission gate is coupled to the input of the common inverter, and the output of the common inverter is coupled to the input of the output inverter and the slave latch.

3. A flip-flop comprising:
   a tri-state inverter configured to receive a flip-flop input, a clock signal and an inverted clock signal;
   a master latch coupled to an output of the tri-state inverter;
   a slave latch coupled to the master latch, the slave latch comprising a slave tri-state inverter;
   an output inverter coupled to receive one of an output of the slave latch and an output of the master latch and configured to generate a flip-flop output;
   a first shared transistor configured to receive a clock signal and having a drain terminal coupled a first transistor in the tri-state inverter and a second transistor in the slave tri-state inverter; and
   a second shared transistor configured to receive an inverted clock signal and having a drain terminal coupled a third transistor in the tri-state inverter and a fourth transistor in the slave tri-state inverter.

4. The flip-flop of claim 3, further comprising a clock inverter for receiving the clock signal to generate the inverted clock signal.

5. The flip-flop of claim 3, wherein a source terminal of the first shared transistor is coupled to a power terminal and a source terminal of the second shared transistor is coupled to ground.

6. The flip-flop of claim 3, wherein the first and second shared transistors are in the tri-state inverter.

7. The flip-flop of claim 3, wherein the first and second shared transistors are in the slave tri-state inverter.

8. The flip-flop of claim 3, wherein the first shared transistor is a PMOS transistor and the second shared transistor is an NMOS transistor.

9. The flip-flop of claim 3, wherein the drain terminal of the first shared transistor is coupled to a source terminal of the first transistor and to a source terminal of the second transistor and the drain terminal of the second shared transistor is coupled to a source terminal of the third transistor and to a source terminal of the fourth transistor.

10. The flip-flop of claim 9, wherein the drain terminals of the first and third transistors are coupled together to provide an output of the tri-state inverter and the drain terminals of the second and fourth transistors are coupled together to provide an output of the slave tri-state inverter.

* * * * *